United States Patent [19]

Bergemont

[11] Patent Number: 5,016,069
[45] Date of Patent: May 14, 1991

[54] LARGE-SCALE EPROM MEMORY

[75] Inventor: Albert Bergemont, La Tronche, France

[73] Assignee: SGS-Thomson Microelectronics S.A., Gentilly, France

[21] Appl. No.: 392,501

[22] Filed: Aug. 11, 1989

[30] Foreign Application Priority Data

Aug. 11, 1988 [FR] France .................. 88 10962

[51] Int. Cl.⁵ .......................................... H01L 29/68
[52] U.S. Cl. ............................ 357/23.5; 357/23.6; 357/23.11; 357/53
[58] Field of Search .............. 357/23.5, 23.6, 23.8, 357/53, 23.11

[56] References Cited

U.S. PATENT DOCUMENTS

| | | | |
|---|---|---|---|
| 4,360,900 | 11/1982 | Bate | 357/23.5 |
| 4,373,248 | 2/1983 | McElroy | 29/571 |
| 4,377,818 | 3/1983 | Kuo et al. | 357/23.5 |
| 4,597,060 | 6/1986 | Mitchell et al. | 357/23.5 |
| 4,812,898 | 3/1989 | Sumihiro | 357/23.5 |
| 4,855,800 | 8/1989 | Esquivel et al. | 357/23.5 |
| 4,868,619 | 9/1989 | Mukherjee et al. | 357/23.5 |
| 4,947,222 | 8/1980 | Gill et al. | 357/23.5 |
| 4,949,305 | 8/1980 | Toyama et al. | 357/23.5 |

FOREIGN PATENT DOCUMENTS

| | | |
|---|---|---|
| 0197284 | 2/1986 | European Pat. Off. . |
| 3426306A1 | 9/1983 | Fed. Rep. of Germany . |
| 2296914 | 12/1974 | France . |
| 2073487 | 10/1981 | United Kingdom . |

Primary Examiner—Andrew J. James
Assistant Examiner—Courtney A. Bowers
Attorney, Agent, or Firm—Lowe, Price, LeBlanc, Becker & Shur

[57] ABSTRACT

An electrically programmable non-volatile memory comprises floating gate MOS transistors (T11, T12, T13) and an array of word lines (LM1 and LM2) along rows and bit lines (LB1, LB2 and LB3) along columns. A constant-potential line (B), arranged along a column so it is positioned between a pair of bit lines, connects the source electrodes (22) of the transistors, and includes a first conductivity type diffusion. A drain electrode (21) of the first conductivity type of each transistor extends along a column to form one of the bit lines (LB1, LB2, LB3). An insulating area (24) extends along a column on the side of each bit line opposite a constant-potential line (B). A conductive area (E) corresponding to the floating gate level covers insulating area (24).

16 Claims, 7 Drawing Sheets

LARGE-SCALE EPROM MEMORY

BACKGROUND OF THE INVENTION

The invention relates to semiconductor memories and specifically to electrically programmable non-volatile memories, currently called EPROM; in particular, the invention relates to the manufacturing of floating gate memories.

For obtaining large-scale memories, for example memories able to store up to 16 megabits, the size of each cell of the memory has to be reduced as much as possible.

But of course, there is a limitation due to physical problems and in particular to the size of photolithographic patterns; another limitation is due to parasitic electrical parameters associated to the manufacturing process which disturb the memory operation.

Except for some proposals that have not met an industrial success, all the industrial approaches for obtaining large-scale memories correspond to a technology comprising the following main points:

an individual memory point corresponds to a MOS transistor having a floating gate made of a first polysilicon level and a control gate corresponding to a second polysilicon level;

the sources of the transistors are connected to a low potential bus Vss;

a word line for addressing a cell line is made of the second polysilicon level;

a bit line for reading the state of a cell is made of a metal (aluminum) line crossing the word lines and contacting from place to place the transistor drains;

for reducing the size of each memory point, only one contact point is provided for two adjacent drains of two transistors in a same column, this contact ensuring a connection with the bit line; also, only one contact is provided between the sources of two adjacent transistors and the bus at Vss;

the transistors are separated from each other by a thick silicon oxide (thick with respect to the transistor gate oxide), and the bit lines and the word lines pass over this thick oxide;

finally, the writing of a data in a memory cell is made in the following way: the sources of all the transistors of the memory are at a low potential Vss (for example zero volt); the word line connected to the control gate of the cell to be programmed is connected to a programmation potential Vpp (for example 15 volts), while all the other word lines are at the low potential Vss; the bit line corresponding to the point to be programmed is put at a high potential Vcc (for example 10 volts), while the bit lines of the points not to be programmed are maintained at the low potential Vss.

With such a memory architecture and the associated programmation mode, the drain of a transistor has to be electrically isolated, through a thick oxide, with respect to the drains of the adjacent transistors of the same word line. If such an isolation is not carried out, it is not possible to program a specific memory point without programming or deprogramming the other ones at the same time.

However, the thick oxide which isolates two adjacent points takes a large surface, mainly when it is obtained by a localized oxidation process (locos).

It has been suggested to replace the localized oxidation by oxide-filled grooves for reducing the total size of the cell, but this technology is not easy to implement industrially.

Structures wherein the thick oxide areas and the multiple contacts towards the drains or sources are cancelled have also been suggested. Those structures permit to reduce the size of the memory array but the addressing system gets more complex and occupies a larger surface.

SUMMARY OF THE INVENTION

To reduce the size of MOS transistor memory cells and increase the storage capacity of the memory, the invention provides a new memory architecture which permits a thick oxide area to be provided only on each two lines of transistors connected to the same word line. Additionally, the architecture avoids the presence of contacts on bit lines between the cells.

According to the invention, the memory comprises floating gate MOS transistors and is constituted by word lines extending according to a first direction (row direction) connecting the control gates of the transistors, and by bit lines extending according to a second direction (column direction) connecting the transistor drains, the word lines being used for designating a determined transistor row and the bit lines permitting to transmit an information on the logical state of the transistors connected thereto. A constant-potential line, extending according to a column, connects the sources of the transistors, is constituted by a diffusion of the first conductivity type and is arranged between each pair of bit lines, all the constant-potential lines being at the same potential. The drain region of the first conductivity type of each transistor extends according to a column in order to form a bit line. An isolation area, extending according to a column, is arranged on the side of each bit line opposed to a constant-potential line. A conductive area covers the isolation areas, this conductive area being made of the same material as the one constituting the transistor floating gates, and this conductive area is obtained during the same manufacturing step as the transistor floating gates.

According to an embodiment of the invention, the transistors belonging to two adjacent rows and to two columns on both sides of the same constant-potential line are arranged in the following way:

each transistor comprises a floating gate mainly constituted by a conductive rectangle arranged over a second conductivity type area constituting the channel of said transistor;

the channels of two adjacent transistors of a same column are separated by a region of the same conductivity type as the channels; and the channels of two transistors of a same row, the two transistors being arranged on both sides of a given constant-potential line, are adjacent to a same region of the opposite conductivity type which separates said transistors and which constitutes the source of the two transistors; the channels of said two transistors are, at their end opposite to the region corresponding to the source, adjacent to a region of the opposite conductivity type which corresponds to the drain of each of said two transistors.

According to an embodiment of the invention, the region covering the isolation area, like the floating gates, is made of polysilicon.

According to an embodiment of the invention, the region covering the isolation area extends, according to a direction parallel to the word lines, on each side of the isolation area according to a chosen length (1).

According to an embodiment of the invention, the region covering the isolation area and the floating gates are arranged at a constant pitch according to the row direction.

According to an embodiment of the invention, in each transistor, a silicon dioxide layer having a thickness lower than 20 nm separates the channel and the floating gate; and the source region can be made of a highly doped region arranged in a pocket of the same conductivity type at a low doping level, whereby electrons may tunnel through the silicon dioxide layer from the floating gate to the high doping level region of the source further to the application of a suitable voltage on the source; the presence of the low doped pocket permits to increase the breakdown voltage between the source and the substrate, whereby the memory can be electrically erased by applying a suitable voltage to the transistor sources.

BRIEF DISCLOSURE OF THE DRAWINGS

The foregoing and other objects, features and advantages of the invention will be apparent from the following detailed description of preferred embodiments as illustrated in the accompanying drawings wherein.

Generally speaking, as conventional in the field of the integrated circuit representation, it will be noted that the various drawings are not drawn to scale either inside one figure or from one figure to the other, and in particular the thicknesses of the various layers are arbitrarily drawn in order to facilitate the legibility of the drawings.

DETAILED DESCRIPTION OF THE INVENTION

Figure 1A:
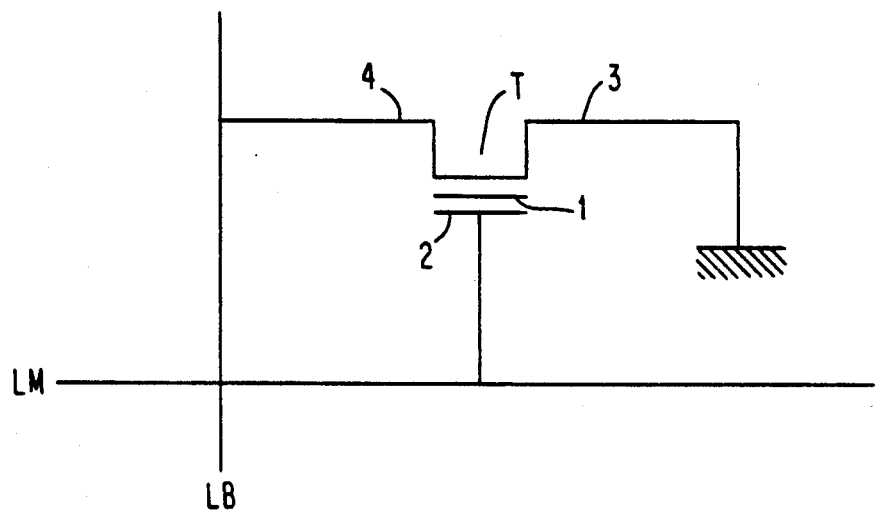
FIGS. 1A and 1B are respectively a schematic electrical and a sectional view of a conventional elementary memory cell.

In FIG. 1A is shown a transistor T of a floating gate memory point. This transistor comprises a floating gate 1 and a control gate 2, together with two semiconductive regions of a first conductivity type (source 3 and drain 4) separated by a channel region having an opposite conductivity type covered by the floating gate 1 and the control gate 2.

The control gate 2 is connected with a word line LM. The drain 4 is connected with a bit line LB.

For writing such a memory point, the floating gate 1 is charged by injection of hot carriers, by applying to the control gate 2, while a current flows between the source 3 and the drain 4, a sufficiently high potential for having the charge carriers (electrons) trapped into the floating gate. This writing operation causes an increase of the conduction threshold of the transistor which, once written (or programmed), will let current flow only for potential values on its control gate higher than when no programmation has been made.

For reading the information contained in a memory point, a voltage higher than the conduction threshold voltage at the non-programmed state and lower than the conduction threshold voltage at the programmed state is applied to the control gate of the transistor of this memory point. If the transistor lets a current flow when a suitable potential difference is applied between the source and the drain, the memory point is at the non-programmed state. If the transistor does not let a current flow, the memory point is at the programmed state.

The voltage applied to the control gate when the memory point is programmed (programmation potential Vpp) is for example equal to 15 volts. The drain potential Vcc is then for example 10 volts and the source potential Vss is for example zero volt (or the ground).

The voltage applied to the control gate during the reading of the memory point is for example 5 volts. The drain potential Vcc is then for example 1.5 volts, and the source potential is then for example zero volt or the ground.

Figure 1B:
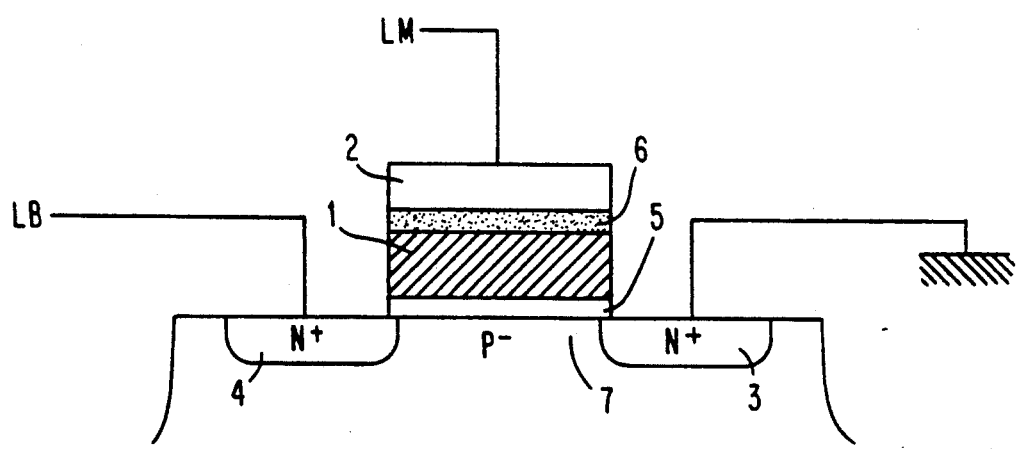

Referring to FIG. 1B that shows a section view of a memory point designed on a silicon wafer, one can see the floating gate 1 and the control gate 2 of the transistor. The source 3 and the drain 4 are two semiconductive regions of a first conductivity type, for example $N^+$, separated by a channel region 7 of the opposite conductivity type, for example $P^-$.

The floating gate 1 of the transistor is made of a first polysilicon level (poly 1). The floating gate is separated from the substrate by a silicon dioxide layer 5, also called gate oxide layer.

Above the floating gate 1, is a silicon dioxide layer 6. The layer 6 is arranged between the floating gate 1 and the control gate 2, the latter being made of a second polysilicon level (poly 2). The silicon dioxide layer 6 is also called interpoly oxide layer.

In the memory, the control gate 2 of the transistor is connected to a word line LM. The source 3 is connected to the ground and the drain 4 to a bit line LB.

Figure 2:
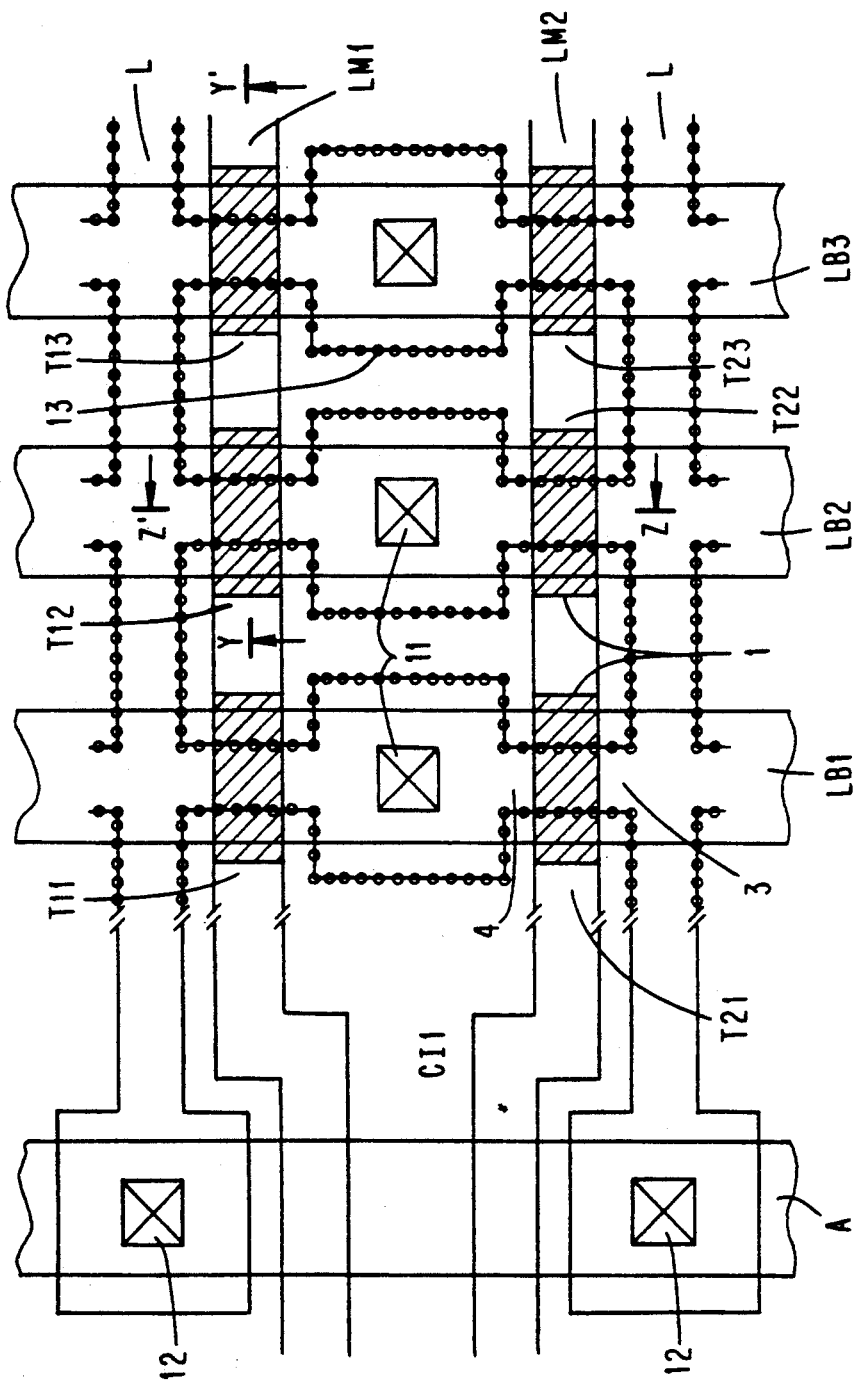
FIG. 2 is a top view of the design of six adjacent memory points on a silicon wafer according to the prior art.

FIG. 2 is a top view of a conventional design of six adjacent memory points on a silicon wafer.

Tij designates a floating gate transistor, i being a row index and j a column index.

The transistors T11-T13 constitute the first row, the transistors T21-T23 constitute the second row.

Transistors T11 and T21 constitute the first column, transistors T12 and T22 the second column and transistors T13 and T23 the third column.

The control gates of the transistors of the same row are interconnected with the same word line, LM1 and LM2 for the rows 1 and 2, respectively.

The transistor drains of the same column are connected to the same bit line, LB1 to LB3 for the columns 1 to 3, respectively.

The word lines are conductors (in practice polysilicon) extending through an horizontal direction (row direction). The bit lines are conductors extending according to a vertical direction (column direction).

The bit lines pass over the transistors Tij constituting the memory points. They are connected with the drains 4 of the transistors by contacts 11. The floating gates 1 of the transistors are arranged between the drains 4 and the sources 3.

The sources of the transistors of a same row are interconnected with a common line L. A pair of transistor rows, separated from an adjacent pair by a contact row 11, shares a single common line L arranged between two rows.

All the common lines L are connected through a contact 12 to a conductive line A which, being at the source potential Vss, permits to apply to the transistor sources the voltage Vss.

An isolation region 13 is arranged between each common line L and each transistor column. In practice, the isolation region is made of a thick silicon oxide.

The floating gate 1 of the transistors projects away from the isolation region.

Figure 3:
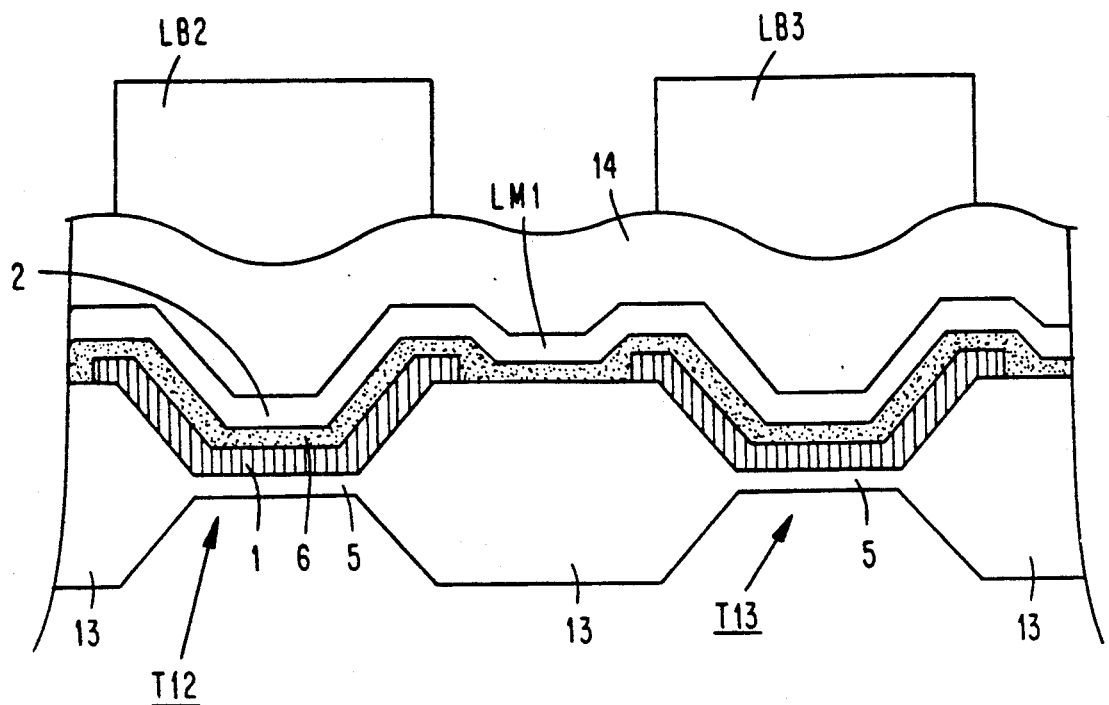
FIG. 3 is a sectional view according to line YY' of FIG. 2.

Two transistors, for example transistors T12 and T13, are shown on FIG. 3 which is a section view according to line YY' of FIG. 2.

The transistors T12 and T13 are separated by an isolation region 13. Under the floating gate 1 is arranged the gate oxide layer 5. The floating gate 1 has a size according to this section view larger than the gate oxide layer 5 and extends on the isolation regions. One will note the interpoly oxide layer 6 above the floating gate. The word line LM1 extends along a transistor row and constitutes the control gate 2 at the transistor positions.

The word line LM1 is covered with an isolation region 14. This isolation region 14 is for example made of boron and phosphorus doped silicon oxide (BPSG) which permits to obtain a flowing at a low temperature (about 850° to 950° C.).

The bit lines LB2 and LB3 are arranged over the isolation layer 14, above the transistors T12 and T13, respectively.

Figure 4:
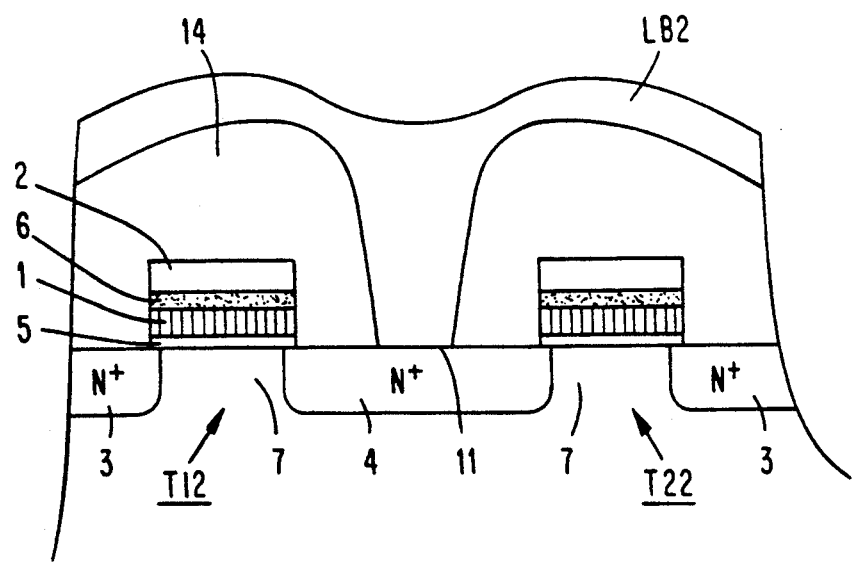
FIG. 4 is a sectional view according to line ZZ' of FIG. 2.

FIG. 4 is a section view according to the line ZZ' of FIG. 2 of the two transistors T12 and T22.

As shown on FIG. 1B, each transistor comprises a source region 3 and a drain region 4 separated by a channel region 7, together with a superposition of layers forming the gate oxide 5, the floating gate 1, the interpoly oxide 6 and the control gate 2.

The control gates of the transistors are covered by the isolation layer 14. The bit line LB2 is connected with the drains of the two transistors by the contact 11.

The above disclosed conventional architecture comprises elements which limit the possible size reduction. On the one hand, there is a series of contacts 11 between the bit lines and the drain areas every two transistor lines. On the other hand, FIG. 2 shows an isolation area 13, made of thick silicon oxide, between each common line pair 2 and each transistor column pair.

Also, one can see on FIG. 4, a step crossing of the bit line LB2 at its contact with the drain regions of transistors T12 and T22. All the bit lines LB, made for example of alumimum, will have to cross such steps at each pair of transistor rows, whereby the aluminum lines are liable to present cracks.

Figure 5:
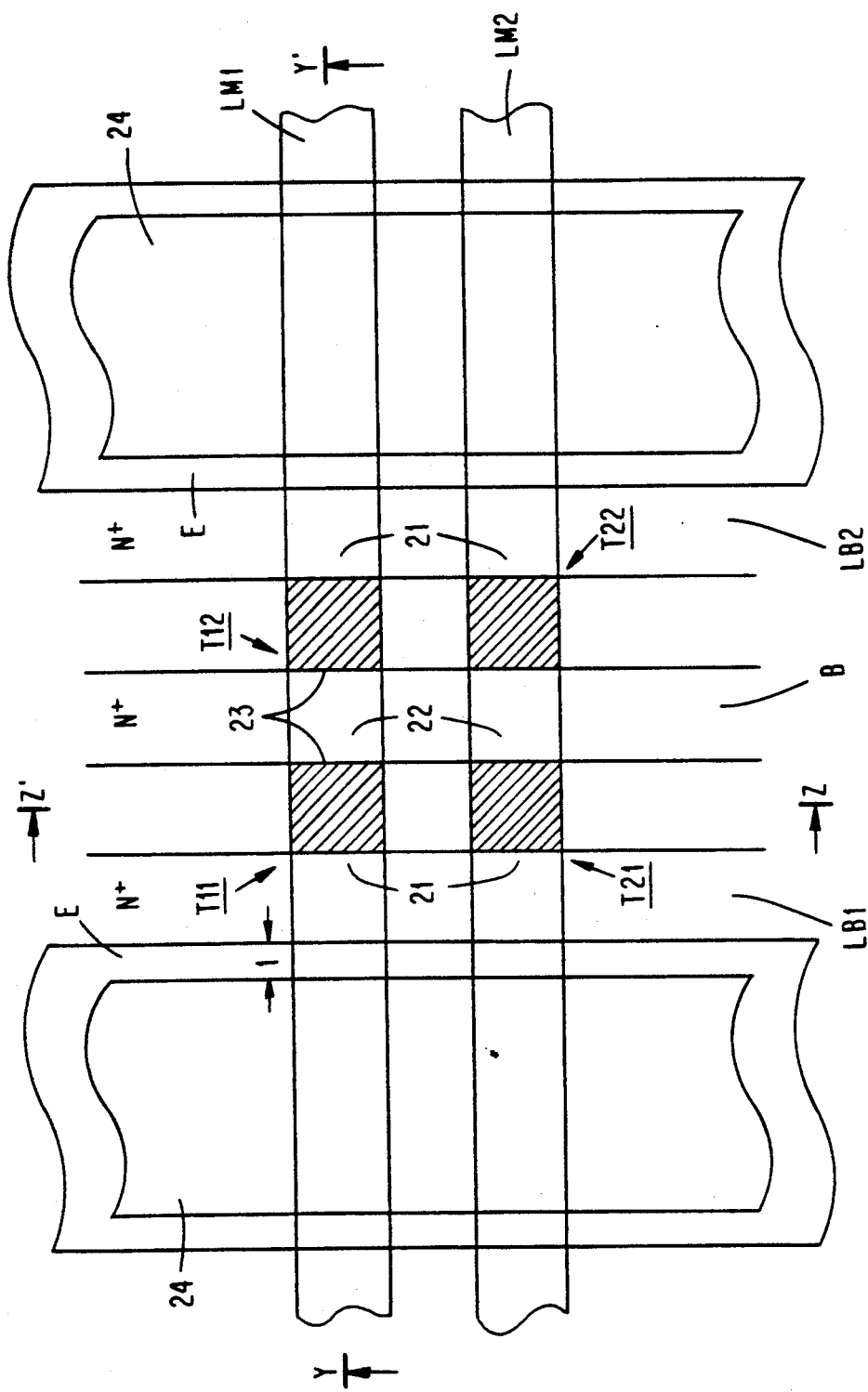
FIG. 5 is a top view of the design of four adjacent memory points on a silicon wafer according to the invention.

The invention, as shown in FIG. 5, avoids those drawbacks.

In the architecture of FIG. 5, the transistors are again arranged according to a row and column array, the transistors of the first row being again designated by T11 and T12, the transistors of the second row by T21 and T22 and Tij designating more generally a transistor at the crossing of row i and column j.

The control gates of the transistors of row i are again interconnected with a generally horizontally directed conductor called word line LMi. The word lines (polysilicon) extend according to a row direction.

The bit lines LBj are made of substrate regions of a first conductivity type, for example N+. Each bit line constitutes directly a drain 21 at the position of each transistor. Therefore, it is no longer necessary to provide for a contact at each pair of rows on each bit line (contacts 11 on FIG. 2).

Conductive constant-potential lines B having a generally vertical orientation are arranged between each pair of bit lines. Those constant-potential lines B correspond to regions of the first conductivity type, like the bit lines LBj, and constitute the sources 22 at the positions of the transistors.

The floating gates 23 of the transistors correspond to a first polysilicon level (poly 1) and are arranged on both sides of each constant-potential line B.

The transistor control gates are arranged over the floating gates, with the interposition of an interpoly oxide layer and are formed by a part of the word lines which are made of a second polysilicon level (poly 2).

As the source and drain of a transistor are arranged according to a horizontal direction, the current in the channel will flow in the horizontal direction or word line direction, and therefore, the transistor will comprise a channel region arranged in the same direction as the word lines.

On each side of the two bit lines LB1 and LB2, arranged on both sides of the same constant-potential line B, are positioned isolation areas 24 which are made of thick silicon oxide.

Areas E, corresponding to the first polysilicon level (poly 1) cover the isolation areas 24.

Those areas E present a projection, according to a length 1, on each side of the isolation areas, according to the horizontal direction. An advantage resulting from those projections will be explained hereinafter.

Figure 6:
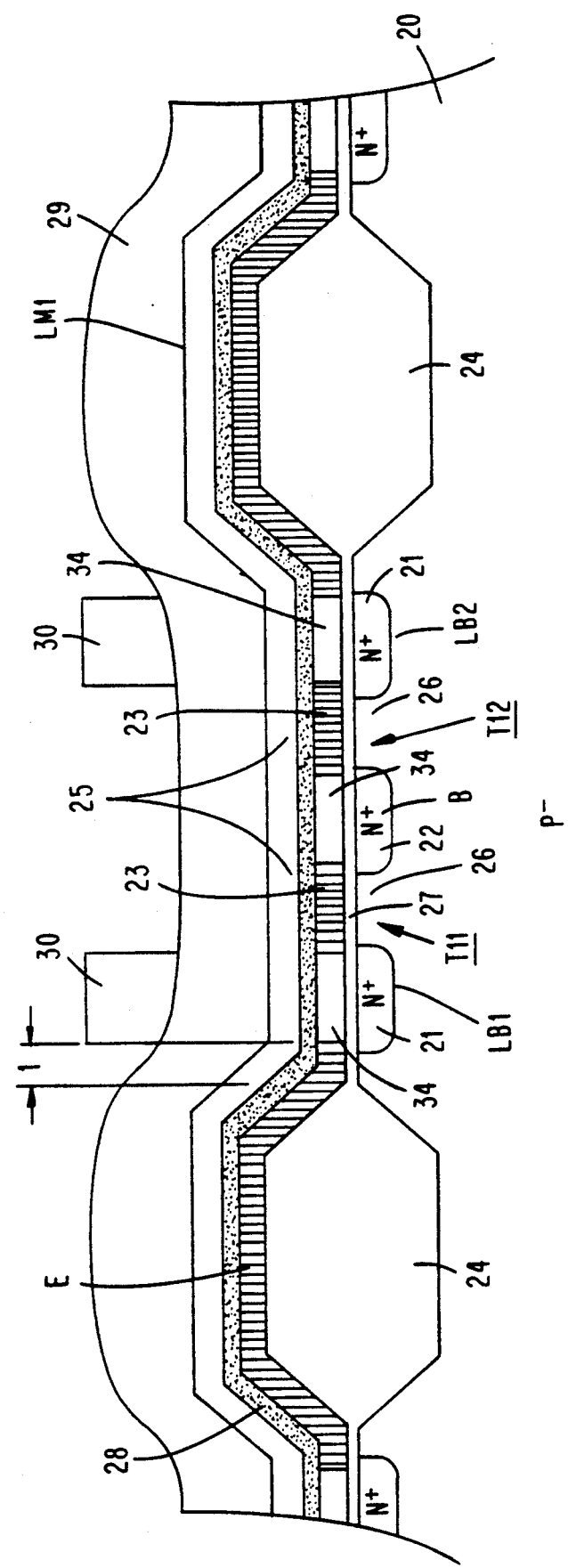
FIG. 6 is a sectional view according to line YY' of FIG. 5.

FIG. 6 shows a section view according to line YY' of FIG. 5 of the two transistors T11 and T12. One can see on FIG. 6:

a constant-potential line B, corresponding to an N+ diffusion which, at the position of the transistors, constitutes the control source 22 for the two transistors T11 and T12;

a bit line LB1 for the transistor T11 and a bit line LB2 for the transistor T12, made of an N+ diffusion, each of which constitutes a drain 21 at the position of a transistor;

a word line LM1, orthogonal to the former lines, made of a second polysilicon level, which constitutes a control gate 25 at the position of a transistor;

two isolation areas 24 arranged on both sides of pairs of transistors of a same row, the sources of which are connected to the same constant-potential line;

two areas E, made of the first polysilicon level, over each isolation area 24 and projecting on each side, parallel to the axis YY', according to a length 1.

The devices are formed on a substrate 20. The source 22 and drain 21 regions of a first conductivity type, for example N+, are separated by a channel region 26 of an opposite conductivity type, for example P−.

Under the floating gates 23 is arranged a gate oxide layer 27 and, between the floating gates and the control gates 25, there is provided an interpoly oxide layer 28.

An oxide layer 34 is arranged between the floating gates 23 of two transistors T11 and T12 and between the floating gates and the areas E. Conventionally, a planarization process is used for having the upper surfaces of this layer 34 and: the upper surface of the first polysilicon layer E at the same level. Layer 34 is for example made of tetra ethyl ortho silicate or TEOS.

The word line LM1 is covered with an isolation layer 29. Layer 29 is for example made of boron and phosphorus doped silicon oxide (BPSG).

Two conductive lines 30, made for example of aluminum, are arranged on the insulating layer 29, each being arranged over a bit line. Those conductive lines 30 extend across the memory.

The conductive lines 30 are connected to bit lines of other memory blocks (in fact, the memory cells are usually grouped according to blocks, each block comprising a given number of rows and columns), thus permitting application of the desired potential to the bit lines and to the transistor drains to which the bit lines are connected.

With the architecture according to the invention, the conductive lines 30 do not have to step crossings on the memory. This is an advantage with respect to the former architecture in which the bit lines, which are conductive lines made for example of aluminum, had to cross steep steps at the contacts arranged between each pair of transistor rows (FIG. 4 shows such a contact).

Figure 7:
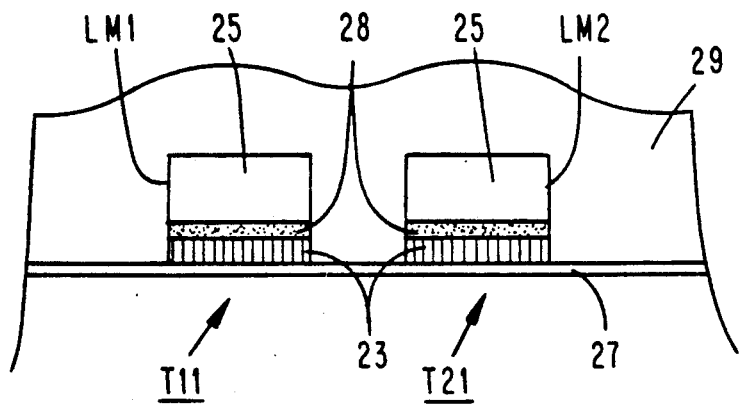
FIG. 7 is a sectional view according to line ZZ' of FIG. 5.

FIG. 7, which is a section view according to line ZZ' of FIG. 5, shows the floating gates 23 of transistors T11 and T21, those floating gates being arranged over the gate oxide layer 27. Two word lines LM1 and LM2 are constituted by the second polysilicon level and, at the position of the transistors, correspond to the control gates 25. Between the control gate and the floating gate is provided an interpoly oxide layer 28. The insulating layer 29 covers the whole structure.

Figure 8:
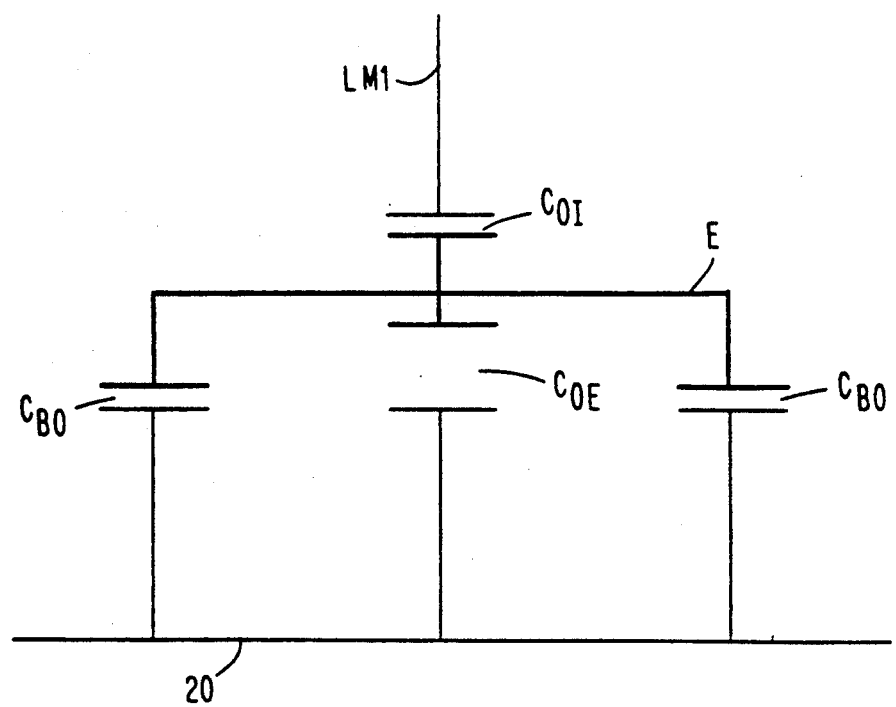
FIG. 8 is an electrical schematic diagram of capacitances existing around an isolation area.

FIG. 8 is an equivalent electrical diagram of the capacitors existing around an insulating area 24 which is for example shown on FIG. 6.

Referring to FIG. 8, a capacitor $C_{OI}$ at the level of the interpoly oxide layer 28 is formed between the word line LM1 and the area E. Another capacitor $C_{OE}$ appears at the portion of the insulating area 24 which is arranged between area E and substrate 20. There is also a capacitor $C_{BO}$ corresponding to the portion of the area E which projects according to a length 1 on each side of the insulating area 24, in correspondence with the portion of the gate oxide layer 27 arranged between the projecting portion and the substrate 20. From FIG. 8, it is apparent that area E floats with respect to the bit lines, word lines and substrate.

Considering a voltage $V_M$ applied to the word line LM1, the voltage $V_E$ on the area E is obtained by calculating the coupling factor $\gamma$ which associates those two voltages by the relation:

$$V_E = \gamma V_M$$

and which is defined by:

$$\gamma = C_{OI}/(C_{OI} + C_{OE} + 2C_{BO})$$

If one considers usual values for the size of the elements:
  length of the isolation area: 1.6 micrometers
  length of the projection 1: 0.4 micrometer
  thickness of the insulating area: 500 nm
  thickness of the interpoly oxide layer: 20 nm
  thickness of the gate oxide layer: 20 nm,
the value of the coupling factor is equal to the ratio between the quantities $(1.6+0.4+0.4)/20$ and $(1.6+0.4+0.4)/20 + 1.6/500 + 2 \times 0.4/20$.

The coupling factor is thus substantially equal to 0.75.

If a voltage $V_M$ equal to 12 volts is applied on the word line LM1, the voltage $V_E$ on the area E will be:
  $V_E = 0.75 \times 12$ volts
  $V_E = 9$ volts The voltage to be withstood by the insulating area 24 is thus reduced; therefore, the architecture according to the invention permits to provide an insulating area having a smaller size than the conventional insulating areas. The size of the memory can therefore be reduced.

Figure 9:
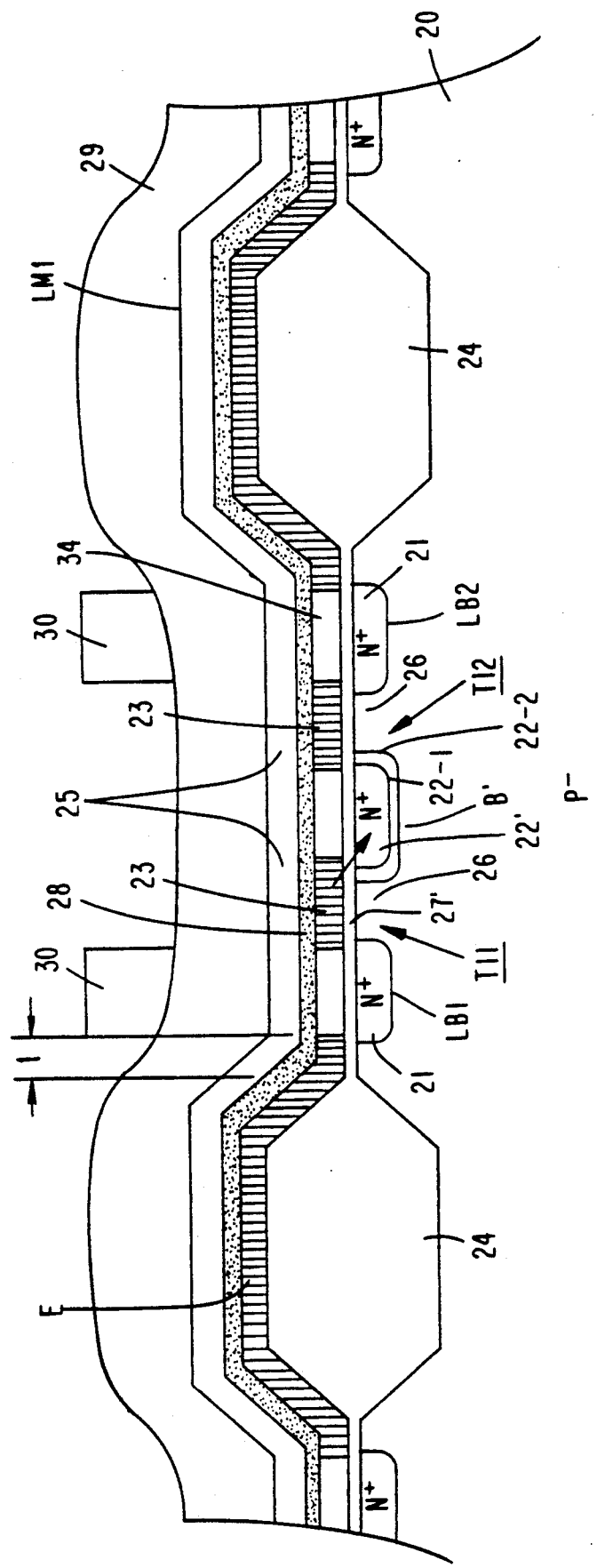
FIG. 9 is a sectional view, analogous to the view of FIG. 6, of an alternative embodiment of the invention.

FIG. 9 shows a variant of the invention. This figure, which is a section view analagous to FIG. 6, comprises the various elements constituting the architecture according to the invention. The main elements are:
  a floating gate 23 corresponding to a first polysilicon level at the position of each transistor;
  two bit lines LB1 and LB2 which correspond to the drain 21 at the position of the transistors;
  two insulating areas 24 made of thick silicon oxide;
  a word line LM1 made of a second polysilicon level, corresponding to the control gate 25 at the position of the transistors;
  a constant-potential line B' which has a different structure with respect to the corresponding line of FIG. 6.

According to the invention, the gate oxide layer 27' of FIG. 9 is very thin with respect to the usual values; its thickness is for example of about 10 nm.

The constant-potential line B' is made of two portions doped at various concentrations. A first portion 22-1 is highly doped, for example N+; this first portion is arranged in a pocket 22-2 of the same conductivity type but with a low doping level, N−.

The constant-potential line B' corresponds to the sources 22' at the positions of the transistors.

This new arrangement permits, if a sufficiently high voltage is applied to the source 22', to transfer through a tunnel effect charge carriers trapped during a writing operation in the transistor floating gate, from the floating gate to the highly doped source portion. This transfer is made possible due to the very small thickness of the gate oxide layer; it is represented by an arrow on FIG. 9. The presence of the second low doped portion permits to increase the breakdown voltage between source and substrate.

However, the contact regions between a thin oxide layer and a thick oxide area include defects which impair the transfer of the charge carriers. Such contact regions can be seen in the conventional structures of electrically erasable memories (EEPROM and flash EPROM).

The advantage of the architecture according to the invention lies in the fact that the thin oxide areas to which the charge carriers migrate contact or are close to a thick oxide layer.

Therefore, it is possible to manufacture EPROM flash memories that are, electrically erasable in response to a suitable voltage applied to the transistor sources.

What is claimed is:

1. A memory having multiple memory points comprising: multiple floating gate MOS transistors arranged on a substrate to correlate with the respective memory points, each of the transistors including a control gate, a floating gate, a source, and a drain region of a first conductivity type, plural word lines extending in a first direction, each of the word lines interconnecting the transistor control gates of a first group of transistors, plural bit lines extending in a second direction, the first and second directions differing from each other by 90°, each of the bit lines interconnecting the transistor drains of a second group of transistors, the drain region of each transistor in the second group extending in the second direction to form one of the bit lines, said word lines addressing a selected transistor row and said bit lines transmitting a signal indicative of a logic state of the transistors;

plural constant-potential lines extending in the second direction, each of the constant potential lines interconnecting the sources of one group of transistors, each of the constant-potential lines including a diffusion of the first conductivity type and being positioned between a pair of adjacent bit lines, all of the contact-potential lines being at the same potential, a plurality of dielectric isolation areas extending in the second direction, each of the isolation areas being positioned on the side of each bit line opposite to one of the constant-potential lines, and plural conductive areas extending in the second direction, each of said conductive areas covering one of said isolation areas.

2. The memory of claim 1 wherein each of said conductive areas floats with respect to said word lines, bit lines and substrate.

3. The memory of claim 1 wherein the conductive areas and floating gates are formed of the same material.

4. The memory of claim 3 wherein said conductive areas (E) are formed during the same manufacturing step as the floating gates of said transistors.

5. The memory of claim 1 wherein the floating gate of each transistor of said one group is mainly formed by a conductive rectangle located over a second conductivity type area forming a channel of said transistor;

the transistors of said one group being in two adjacent rows and two columns on each side of one constant-potential line;

the channels of two adjacent transistors of one column being spaced by a region having the second conductivity type;

the channels of two transistors being in one row, the two transistors being arranged on both sides of a given constant-potential line, the channels of the two transistors being adjacent a single region of the first conductivity type, the single region separating said two transistors and forming the source of the two transistors; and ends of the channels of said two transistors opposite to the region corresponding to the source being adjacent a region of the first conductivity type corresponding to the drain of each of said two transistors.

6. The memory of claim 1 wherein the conductive area covering said isolation area, and the floating gates are formed of polycrystalline silicon.

7. The memory of claim 1 wherein said conductive area covering said isolation area projects a predetermined distance from each side of the isolation region in a direction parallel to the word lines.

8. The memory of claim 2 wherein each of said conductive areas covering said isolation areas and the floating gates are arranged to have a constant pitch in the first direction.

9. The memory of claim 2 wherein each transistor includes: a silicon dioxide layer having a thickness less than 20 nm separating the channel from the floating gate, and wherein the sources are formed of a highly doped section arranged in a pocket having the first conductivity type and a low doping level, whereby electrons may tunnel through the silicon dioxide layer from the floating gates to the highly doped source region in response to a selected voltage being applied to the source, whereby the memory is electrically erasable.

10. A memory having multiple memory points comprising:

multiple floating gate MOS transistors arranged on a substrate to correlate with the respective memory points, each of the transistors including a control gate, a floating gate, a source, a drain region of a first conductivity type, a gate oxide layer between the floating gate and the substrate, and a channel in the substrate between the source and drain controlled by voltage applied to the control gate through the gate oxide layer and the floating gate, plural work lines extending in a first direction, each of the word lines interconnecting the transistor control gates of a first group of transistors, plural bit lines extending in a second direction, the first and second directions differing from each other by 90°, each of the bit lines interconnecting the transistor drains of a second group of transistors, the drain region of each transistor in the second group extending in the second direction to form one of the bit lines, said word lines addressing a selected transistor row and said bit lines transmitting a signal indicative of a logic state of the transistors;

plural constant-potential lines extending in the second direction, each of the constant potential lines interconnecting the sources of one group of transistors, each of the constant-potential lines including a diffusion of the first conductivity type and being positioned between a pair of adjacent bit lines, all of the constant-potential lines being at the same potential, a plurality of dielectric isolation areas extending in the second direction, each of the isolation areas being positioned on the side of each bit line opposite to one of the constant-potential lines, the gate oxide layer extending between adjacent ones of the isolation areas, plural conductive areas extending in the second direction, each of said conductive areas covering one of said isolation areas, plural dielectric layers extending in the second direction, each of the plural dielectric layers extending over one of the conductive areas and the floating gates of plural transistors of the second group, said conductive areas effectively forming electrodes for first, second and third capacitors respectively including as dielectrics the gate oxide layer, one of the dielectric isolation areas and the plural dielectric layers.

11. The memory of claim 10 wherein the conductive areas and floating gates are formed of the same material.

12. The memory of claim 11 wherein said conductive area (E) is formed during the same manufacturing step as the floating gates of said transistors.

13. The memory of claim 11 wherein each of said conductive areas floats with respect to said word lines, bit lines and substrate.

14. A memory having multiple memory points comprising: multiple floating gate MOS transistors arranged on a substrate to correlate with the respective memory points, each of the transistors including a control gate, a floating gate, a source, and a drain region of a first conductivity type, plural word lines, each of the word lines interconnecting the transistor control gates of a first group of transistors, plural bit lines, each of the bit lines interconnecting the transistor drains of a second group of transistors, the drain region of each transistor in the second group forming one of the bit lines, said word lines addressing selected transistors in the first group and said bit lines transmitting a signal indicative of a logic state of the transistors;

plural constant-potential lines, each of the constant potential lines interconnecting the sources of one group of transistors, each of the constant-potential lines including a diffusion of the first conductivity type and being positioned between a pair of adjacent bit lines, all of the constant-potential lines being at the same potential, a plurality of dielectric isolation areas, each of the isolation areas being positioned on the side of each bit line opposite to one of the constant-potential lines, and plural floating conductive areas, each of said conductive areas covering one of said isolation areas.

15. The memory of claim 14 wherein the conductive areas and floating gates are formed of the same material.

16. The memory of claim 14 wherein each transistor includes: a silicon dioxide layer having a thickness less than 20 nm separating the channel from the floating gate, and wherein the region corresponding to the sources is formed of a highly doped section arranged in a pocket having the same conductivity type and a low doping level, whereby electrons may tunnel through the silicon dioxide layer from the floating gates to the highly doped source region in response to a selected voltage being applied to the source, whereby the memory is electrically erasable.

* * * * *